United States Patent
Yoo et al.

(10) Patent No.: US 6,591,161 B2
(45) Date of Patent: Jul. 8, 2003

(54) METHOD FOR DETERMINING ROBOT ALIGNMENT

(75) Inventors: Woo Sik Yoo, Palo Alto, CA (US); Kitaek Kang, Dublin, CA (US)

(73) Assignee: WaferMasters, Inc., San Jose, CA (US)

( * ) Notice: Subject to any disclaimer, the term of this patent is extended or adjusted under 35 U.S.C. 154(b) by 137 days.

(21) Appl. No.: 09/773,034

(22) Filed: Jan. 31, 2001

(65) Prior Publication Data

US 2002/0103571 A1 Aug. 1, 2002

(51) Int. Cl.$^7$ ................................................ G06F 7/00
(52) U.S. Cl. ................... 700/218; 700/259; 414/800; 414/936; 414/937; 901/16; 901/46; 901/47
(58) Field of Search ................... 700/213, 218, 700/245, 249; 414/800, 935, 936, 937, 939, 941; 901/16, 46, 47; 318/568.16, 640

(56) References Cited

U.S. PATENT DOCUMENTS

| | | | |
|---|---|---|---|
| 4,326,805 A | 4/1982 | Feldman et al. | 356/399 |
| 4,457,664 A | 7/1984 | Judell et al. | 414/779 |
| 4,475,122 A | 10/1984 | Green | 358/101 |
| 4,819,167 A | 4/1989 | Cheng et al. | 364/167.01 |
| 4,955,780 A | 9/1990 | Shimane et al. | 414/44.2 |
| 5,405,230 A * | 4/1995 | Ono et al. | 414/217 |
| 5,435,683 A * | 7/1995 | Oosawa et al. | 414/217 |
| 5,497,007 A | 3/1996 | Uritsky et al. | 250/491.1 |
| 5,740,034 A | 4/1998 | Saeki | 364/167.01 |
| 5,740,062 A | 4/1998 | Berken et al. | 364/478.06 |
| 5,813,819 A * | 9/1998 | Ohsawa et al. | 414/16.08 |
| 5,905,850 A | 5/1999 | Kaveh | 395/94 |
| 5,915,915 A | 6/1999 | Allen et al. | 414/744.1 |
| 5,917,601 A | 6/1999 | Shimazaki et al. | 356/375 |
| 5,990,650 A | 11/1999 | Brock | 318/640 |
| 6,135,854 A | 10/2000 | Masumura et al. | 451/6 |
| 6,220,808 B1 * | 4/2001 | Bonora et al. | 414/217 |
| 6,275,742 B1 | 8/2001 | Sagues et al. | 700/213 |
| 6,298,280 B1 | 10/2001 | Bonora et al. | 700/218 |
| 6,377,870 B1 * | 4/2002 | Blaesing-Bangert et al. | 700/245 |

FOREIGN PATENT DOCUMENTS

| | | | |
|---|---|---|---|
| EP | 0 502 412 | 9/1992 | H01L/21/00 |
| EP | 0 747 945 | 12/1996 | H01L/21/66 |

OTHER PUBLICATIONS

DT Vision Foundry, Internet Article, www.datatranslation.com, handout (3 pages).
Sherlock Machine Vision Software, General Purpose Machine Vision Application, Imaging Technology 1997–1999 (2 pages).
Digital Image Processing, Principles and Applications, Gregory A. Baxes, pp. 129–159 (15 pages).

* cited by examiner

Primary Examiner—Khoi H. Tran
(74) Attorney, Agent, or Firm—MacPherson Kwok Chen & Heid LLP

(57) ABSTRACT

A robot wafer alignment tool uses a reflector mounted on a multi-axis robot to determine the position of the robot or other objects within a chamber. The reflector reflects images to at least one camera from an area or object of interest in the chamber.

25 Claims, 10 Drawing Sheets

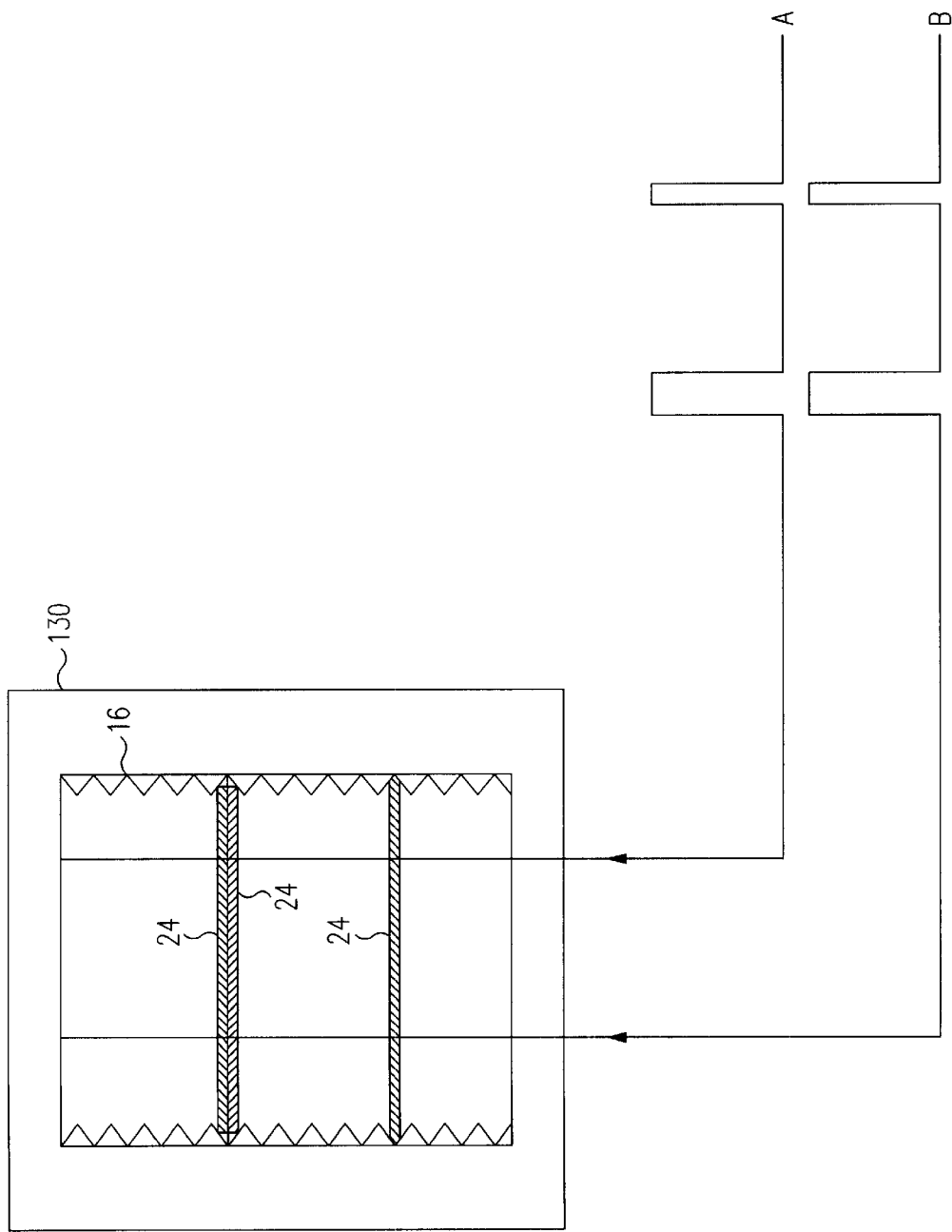

METHOD FOR DETERMINING ROBOT ALIGNMENT

BACKGROUND OF THE INVENTION

1. Field of the Invention

This invention generally relates to semiconductor manufacturing equipment and more particularly to systems and methods for the positioning and alignment of a robot and/or semiconductor materials during the manufacturing process using a reflector to reflect an image of the robot and/or semiconductor materials.

2. Description of Related Art

Semiconductor manufacturing equipment is used to process semiconductor wafers into electronic devices. Typically, in this equipment, the wafers are contained in a carrier. While in the carrier, the positions of the wafers are "mapped" to determine the number of wafers to be processed and the slot location of each wafer in the carrier. Wafer mapping enables the manufacturing equipment to return a processed wafer to the original slot location from which the wafer came. Returning the wafer into its original slot location in the carrier is important because equipment operators rely on slot locations to distinguish the wafers. Knowing the number of wafers contained in the carrier is also important because a computer monitoring and operating the manufacturing equipment needs to be updated as to when all the wafers in the carrier have been processed in order to alert an equipment operator to manually move the carrier out of a load lock.

Wafer mapping has been performed using laser beams. Typically, the carrier is slowly moved in a vertical direction to cross the path of a horizontally aimed laser beam. A computer keeps track of when and how many times the wafers break the beam. By knowing the distance between the slots of the carrier, the computer can determine the number of wafers and the location of each wafer in the carrier. Because each wafer in the carrier is moved to break the beam, using a laser beam to perform wafer mapping takes time. Further, detecting a cross-slotted wafer (i.e., a single wafer which occupies two slots at an angle) is difficult using a laser beam because of the limited area which a beam can cover.

Therefore, a need exists for an improved method and apparatus for monitoring the processing of semiconductor materials as well as determining the location of the materials being processed.

SUMMARY OF THE INVENTION

In accordance with the invention, a method and associated apparatus are disclosed for determining robot alignment with semiconductor wafers, wafer-like objects and other semiconductor manufacturing equipment.

In accordance with one embodiment of this invention, a method of robot automated alignment comprises viewing a robot with an arm radius, angular orientation and vertical position wherein the robot is located within a chamber; determining the arm radius, angular orientation and vertical position of the robot wherein the vertical position of the robot is determined by viewing an image reflected by a reflector located within said chamber; comparing the arm radius, angular orientation and vertical position of the robot to pre-set positions; and adjusting the arm radius, angular orientation and vertical position of the robot to the pre-set positions.

In accordance with one embodiment of this invention, a method of determining robot status via live feedback to a user comprises taking images of a robot with an arm radius, angular orientation and vertical position using a camera wherein the robot is located within a chamber and the vertical position of the robot is determined by viewing the images reflected by a reflector located within said chamber; and displaying the images on a user interface so that the user may view the robot in near real-time.

In accordance with one embodiment of this invention, a method of material tracking comprises viewing a robot with an arm radius, angular orientation and vertical position using a camera wherein the robot is located within a chamber and is holding a workpiece; determining the arm radius, angular orientation and vertical position of the robot; and determining the position of the workpiece from the arm radius, angular orientation and vertical position of the robot wherein the vertical position of the robot is determined by viewing an image reflected by a reflector located within said chamber.

In accordance with one embodiment of this invention, a method of movement error handling comprises viewing a robot with an arm radius, angular orientation and vertical position using a camera wherein the robot is located within a chamber and is holding a workpiece; determining the arm radius, angular orientation and vertical position of the robot; determining the position of the workpiece from the arm radius, angular orientation and vertical position of the robot wherein the vertical position of the robot is determined by viewing an image reflected by a reflector located within said chamber; comparing the position of the workpiece to a pre-set position; and adjusting the arm radius, angular orientation and vertical position of the robot so that the workpiece is moved to the preset position.

In accordance with one embodiment of this invention, a method of wafer mapping comprises viewing a cassette through an image of said cassette reflected by a reflector; determining the position of a wafer within a slot in the cassette; comparing the position of the wafer to a desirable position; and alerting a user if the wafer in not in the desirable position.

In accordance with one embodiment of this invention, a method of verifying the loading of material into a cassette with a plurality of notches comprises viewing the cassette using a camera wherein the positions of the notches are determined by viewing an image of the cassette reflected by a reflector to the camera; determining the positions of the notches; comparing the positions of the notches to pre-set positions; and adjusting the position of the cassette so that the notches match the pre-set positions.

In accordance with one embodiment of this invention, a robot wafer alignment tool comprises a chamber for processing of semiconductor materials; at least one camera mounted to said chamber for monitoring the processing of semiconductor materials; a computer located outside the chamber for processing images from said at least one camera; a robot located within the chamber for transporting semiconductor materials within the chamber; at least one reflector located within the chamber for reflecting at least one image from a first area within the chamber to the camera; at least one opening in the chamber to aid in the transmission of the at least one image from the chamber to the computer; and a cassette with a plurality of slots within the chamber for holding semiconductor materials.

This invention will be more fully understood in light of the following detailed description taken together with the accompanying drawings.

BRIEF DESCRIPTION OF THE DRAWINGS

FIG. 5B illustrates the detection of a double-wafer in a single slot.

Use of the same reference symbols in different figures indicates similar or identical items.

DETAILED DESCRIPTION OF THE PREFERRED EMBODIMENTS

In accordance with this invention, a method and apparatus are disclosed for determining robot alignment of semiconductor wafers and wafer-like objects contained in a carrier or container. The invention may be used in a variety of applications including the manufacture of semiconductor devices, hard disks, and liquid crystal displays. By way of example, the invention can be used in robot alignment automation, robot status live feedback, material tracking, movement error handling, wafer mapping, material load verification, etching, deposition, chemical-mechanical planarization, and rapid thermal processing systems.

Figure 1B:
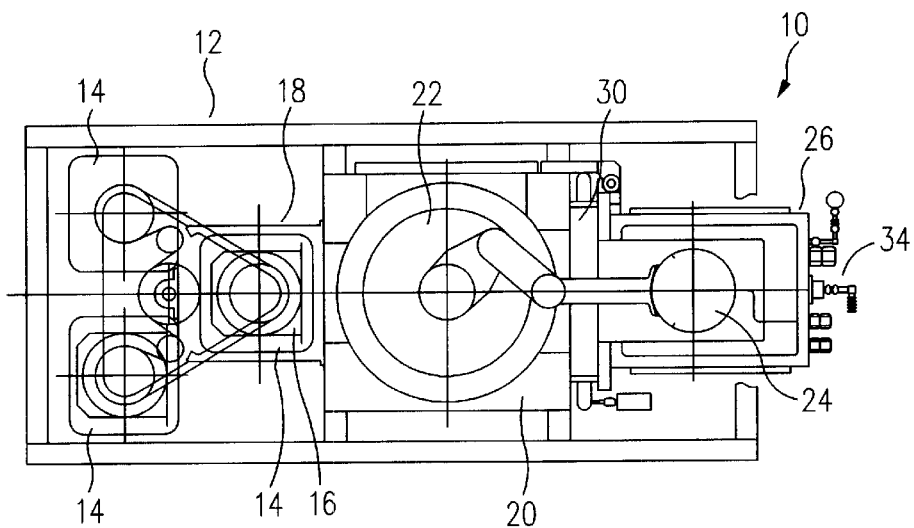
FIGS. 1A and 1B are schematic illustrations of a side view and top view, respectively, of a semiconductor wafer processing system for use with the present invention.
Figure 1A:
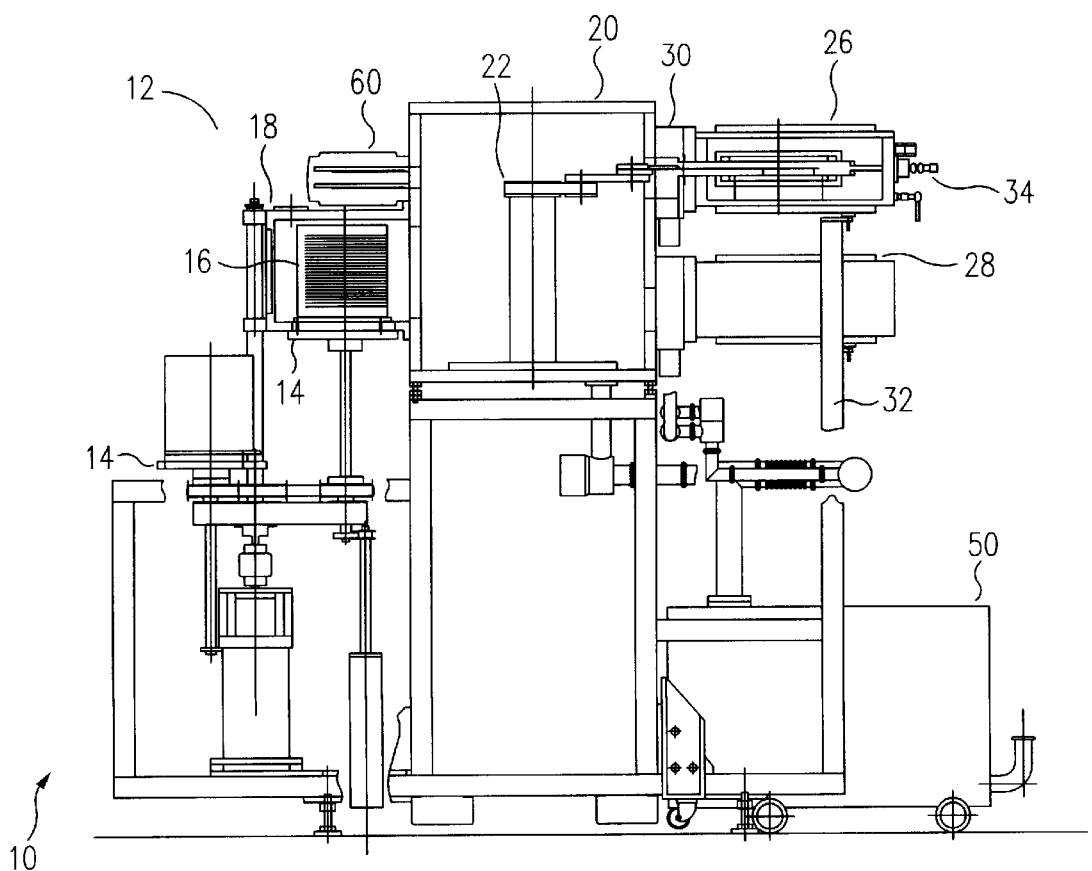

FIGS. 1A and 1B are schematic illustrations of a side view and top view, respectively, of one embodiment of a semiconductor wafer processing system 10 that establishes a representative environment of the present invention. The representative system is fully disclosed in U.S. patent application Ser. No. 09/451,677 (Attorney Docket No. M-7771 US), now U.S. Pat. No. 6,410,455, which is herein incorporated by reference for all purposes. Processing system 10 includes a loading station 12 which has multiple platforms 14 for supporting and moving a wafer cassette 16 up and into a loadlock 18. Wafer cassette 16 may be a removable cassette which is loaded into a platform 14, either manually or with automated guided vehicles (AGV). Wafer cassette 16 may also be a fixed cassette, in which case wafers are loaded onto cassette 16 using conventional atmospheric robots or loaders (not shown). Once wafer cassette 16 is inside loadlock 18, loadlock 18 and transfer chamber 20 are maintained at atmospheric pressure or else are pumped down to a vacuum pressure using a pump 50. A robot 22 within transfer chamber 20 rotates toward loadlock 18 and picks up a wafer 24 from cassette 16. A reactor or thermal processing chamber 26, which may also be at atmospheric pressure or under vacuum pressure, accepts wafer 24 from robot 22 through a gate valve 30. Optionally, additional reactors may be added to the system, for example reactor 28. Robot 22 then retracts and, subsequently, gate valve 30 closes to begin the processing of wafer 24. After wafer 24 is processed, gate valve 30 opens to allow robot 22 to pick-up and place wafer 24 into cooling station 60. Cooling station 60 cools the newly processed wafers before they are placed back into a wafer cassette in loadlock 18. In one embodiment, reactors 26 and 28 are RTP reactors, such as those used in thermal anneals. In other embodiments, reactors 26 and 28 may also be other types of reactors, such as those used for dopant diffusion, thermal oxidation, nitridation, chemical vapor deposition, and similar processes. Reactors 26 and 28 are generally horizontally displaced though they may be vertically displaced (i.e. stacked one over another) to minimize floor space occupied by system 10. Reactors 26 and 28 are bolted onto transfer chamber 20 and are further supported by a support frame 32. Process gases, coolant, and electrical connections may be provided through the rear end of the reactors using interfaces 34.

Figure 2A:
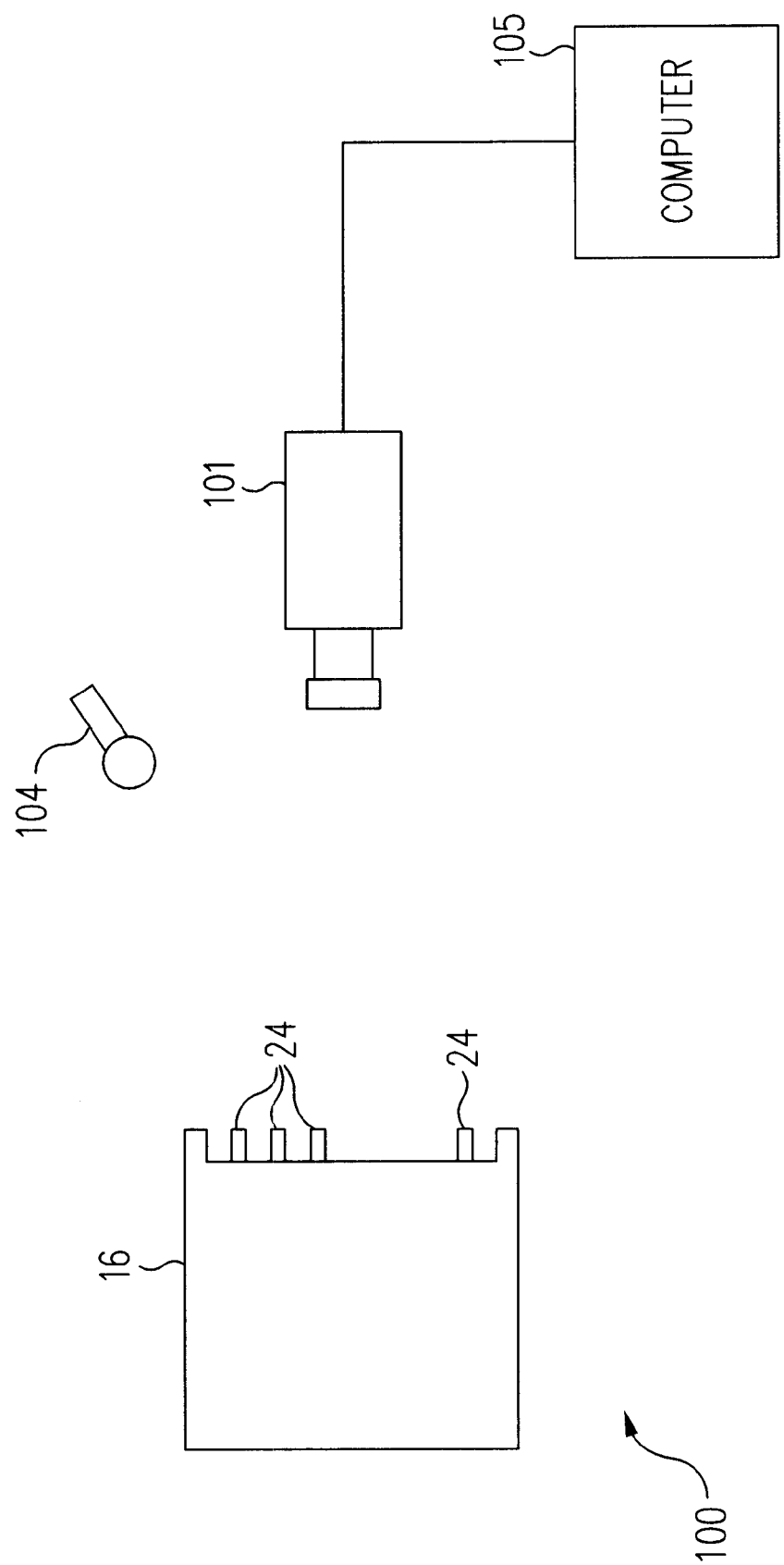
FIG. 2A shows a pictorial diagram of a wafer mapping system for use with the present invention.
Figure 2C:
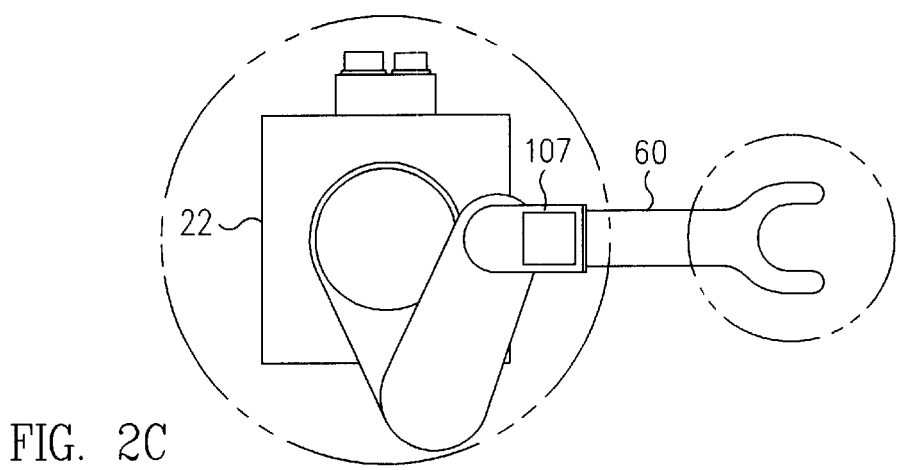
FIG. 2C illustrates a plan view of the prism and robot arm of FIG. 2B.
Figure 2B:
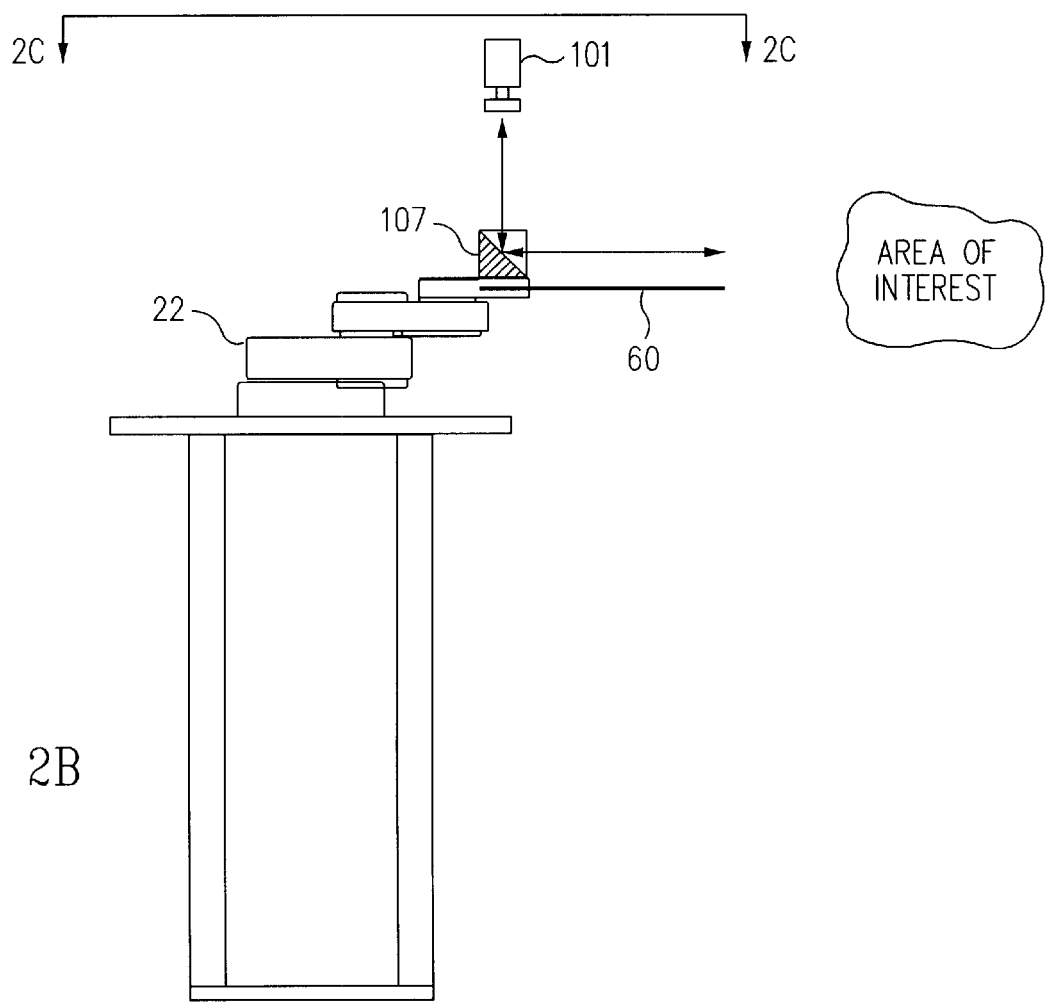
FIG. 2B illustrates a prism mounted on a robot arm reflecting light to a camera.
Figure 2E:
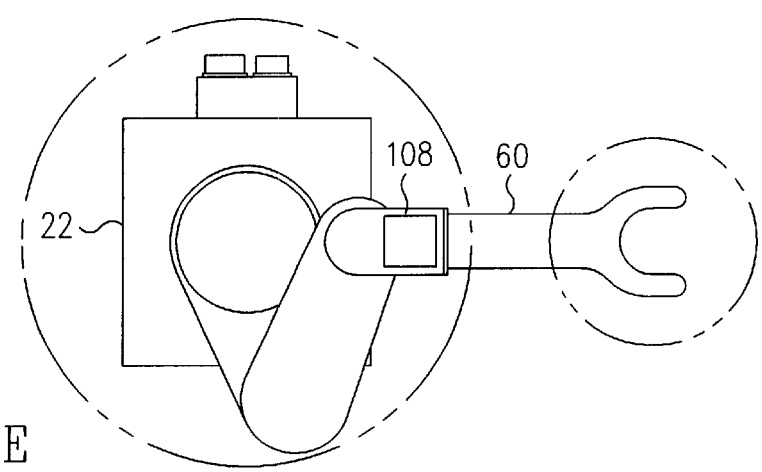
FIG. 2E illustrates a plan view of the mirror and robot arm of FIG. 2D.
Figure 2D:
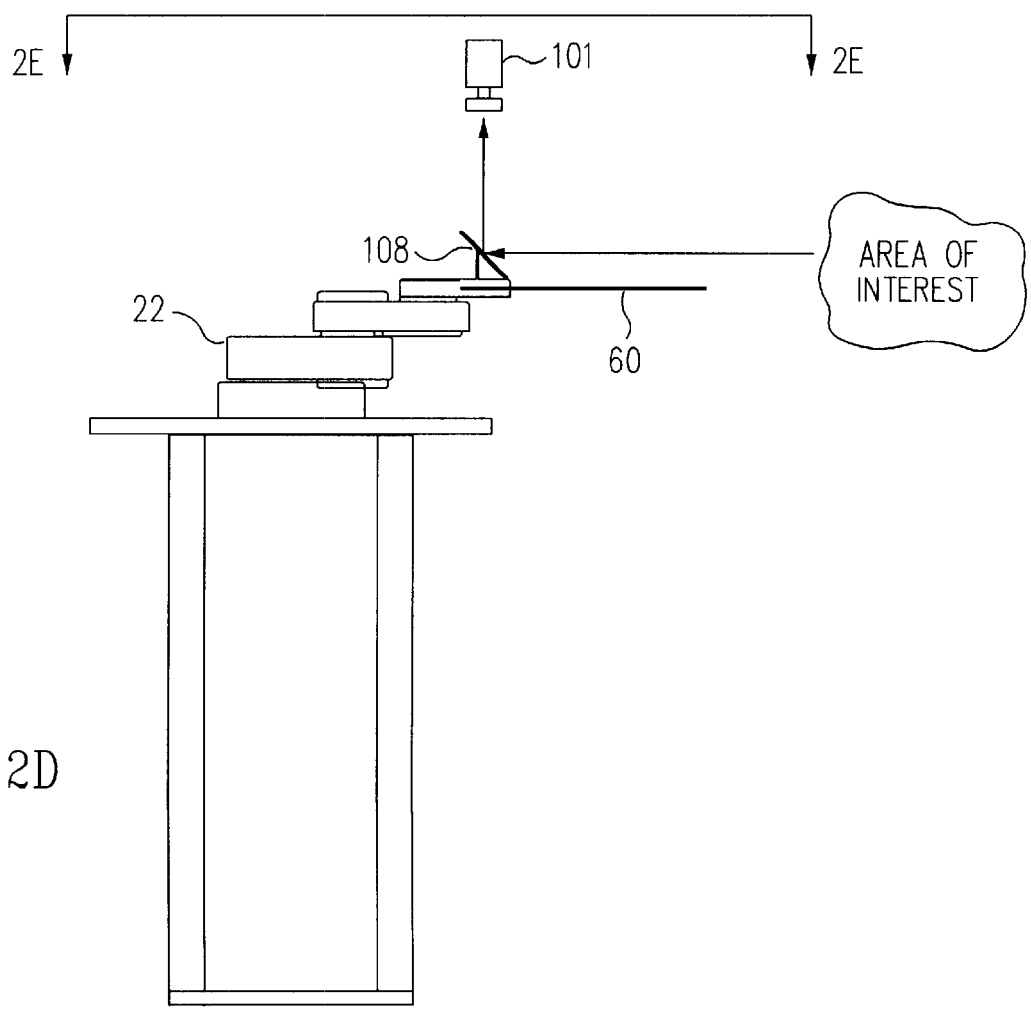
FIG. 2D illustrates a mirror mounted on a robot arm reflecting light to a camera.

FIG. 2A shows a pictorial diagram of one embodiment of a wafer mapping system 100 that establishes a representative camera system of the present invention. A representative system is fully disclosed in co-pending U.S. patent application Ser. No. 09/451,674 (Attorney Docket No. M-7770 US), which is herein incorporated by reference for all purposes. An alternative representative wafer mapping system is fully disclosed in co-pending U.S. patent application Ser. No. 09/648,833 (Attorney Docket No. M-8249 US), which is herein incorporated by reference for all purposes. Referring to FIG. 2A, an image of wafers 24 contained in a carrier or cassette 16 is acquired using a camera 101. Carrier 16 may be a fixed or removable carrier. Camera 101 is a QUICKCAM™ Home camera from Logitech Corporation of Fremont, Calif. Camera 101 may also be any conventional camera such as a video camera, a photographic camera, or a digital camera. Light source 104 provides lighting when system 100 is employed in a dark environment. The image acquired using camera 101 is provided to a computer 105 for subsequent image processing. If the Logitech QUICKCAM™ Home camera is used, the output of camera 101 is a digitized image which is provided to computer 105 via a Universal Serial Bus ("USB") (not shown). Otherwise, the image acquired using camera 101 is first digitized using a conventional digitizer before the image is processed in computer 105.

FIGS. 2B, 2C, 2D & 2E illustrate a reflector, such as a prism 107 (FIGS. 2B & 2C), manually adjustable mirror 108 (FIGS. 2D & 2E) or other device capable of reflecting an image, mounted on the robot arm 22. The reflector may be mounted to robot arm 22 using a number of means including, without limitation, bonding materials, adhesives, and screws. The reflector is aligned with an end effector 60 of robot arm 22. A camera 101 is mounted above the reflector. The reflector reflects light at an angle, preferably a 90 degree angle, such that camera 101 is able to indirectly view an area of interest.

System 100 can be employed in any location of a semiconductor manufacturing equipment 10 (FIGS. 3A & 4A) where wafer mapping or any viewing function is desired. A camera can be placed either outside (FIG. 3A) or inside (FIG. 4A) a transfer chamber 20.

Figure 3A:
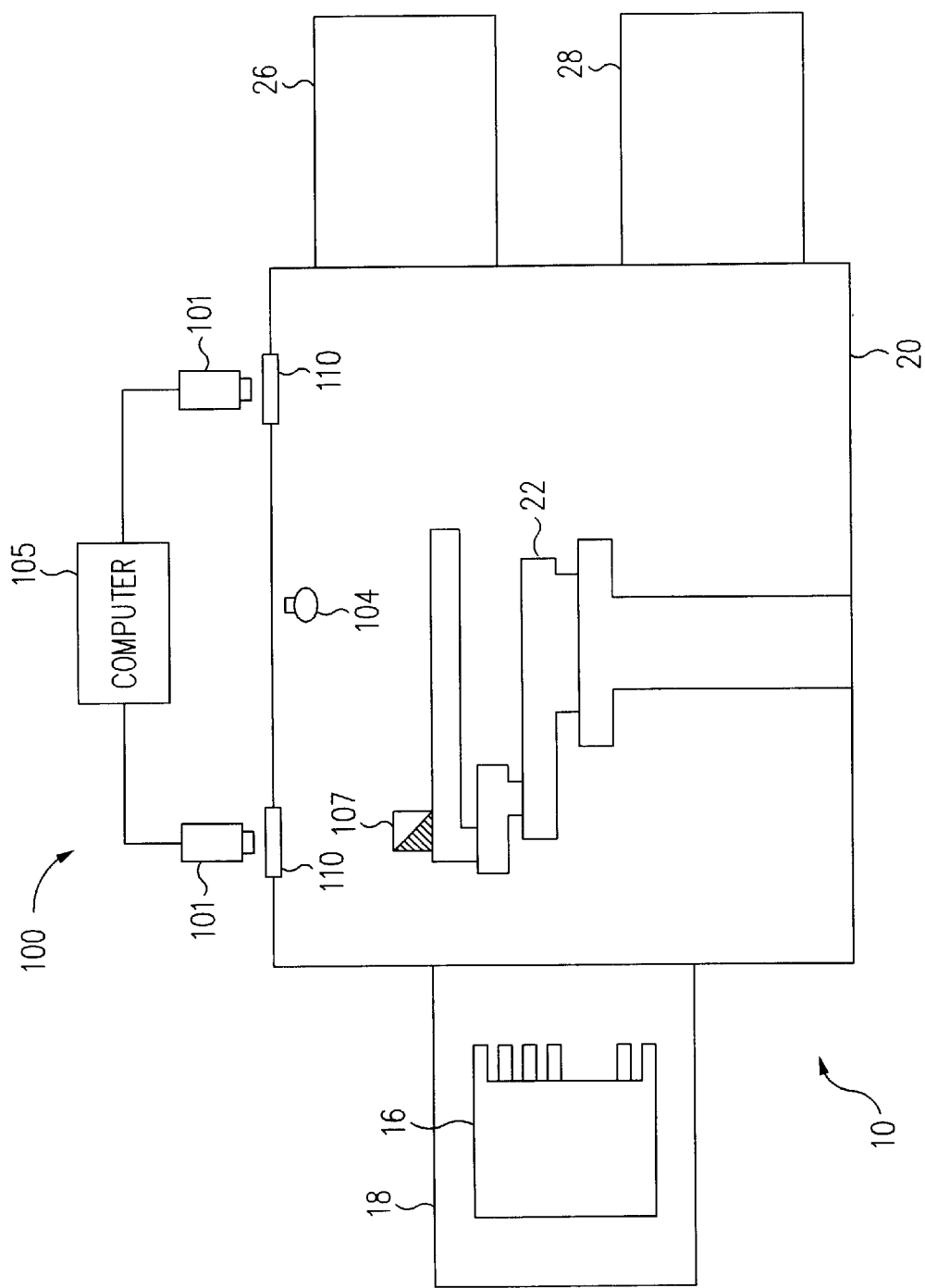
FIG. 3A illustrates a camera mounted outside a chamber and a prism mounted on a robot arm.
Figure 4A:
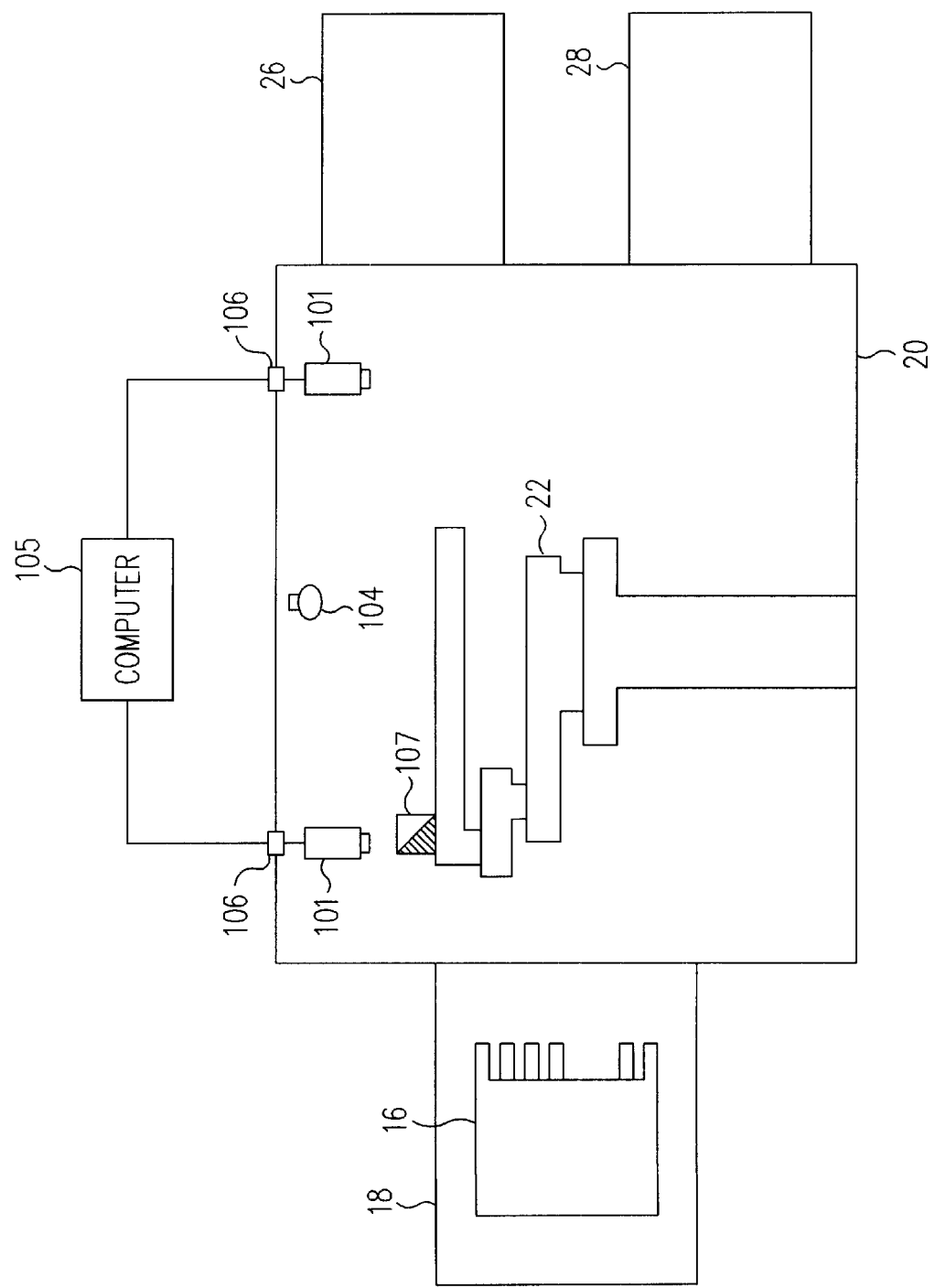
FIG. 4A illustrates a camera mounted inside a chamber and a prism mounted on a robot arm.

In accordance with one embodiment of the invention, FIG. 3A illustrates prism 107 mounted on robot arm 22 and one or more cameras 101 mounted outside transfer chamber 20. FIG. 4A differs from FIG. 3A only in that cameras 101 are mounted inside transfer chamber 20. The camera 101 positioned over prism 107 acquires an image of an area or object of interest within chamber 20, for example, carrier 16. Although camera 101 itself is mounted outside chamber 20, there are one or more viewing ports or windows 110 on the top side of transfer chamber 20 such that a camera 101 can view the inside of chamber 20. In the alternative, a single camera 101 can be mounted outside the chamber such that the camera 101 can be moved from one window to another either by hand or by moving camera 101 along a track (not shown). A typical window 110 is made of a transparent material such as glass, PYREX or quartz. If glass is used, the glass must be thick enough to withstand the pressure differential between the internal and external pressures of chamber 20. However, if glass used is too thick, light deflection and transmission problems may arise. An image of carrier 16 may be acquired using camera 101 while multi-axis robot 22 is positioned within chamber 20. Camera 101 is operationally connected to computer 105 which is operationally connected to robot 22. Computer 105 monitors the position and orientation of robot 22. Prism 107 is mounted on a portion of robot 22 such that an image of the area of interest can be reflected to camera 101.

Figure 3B:
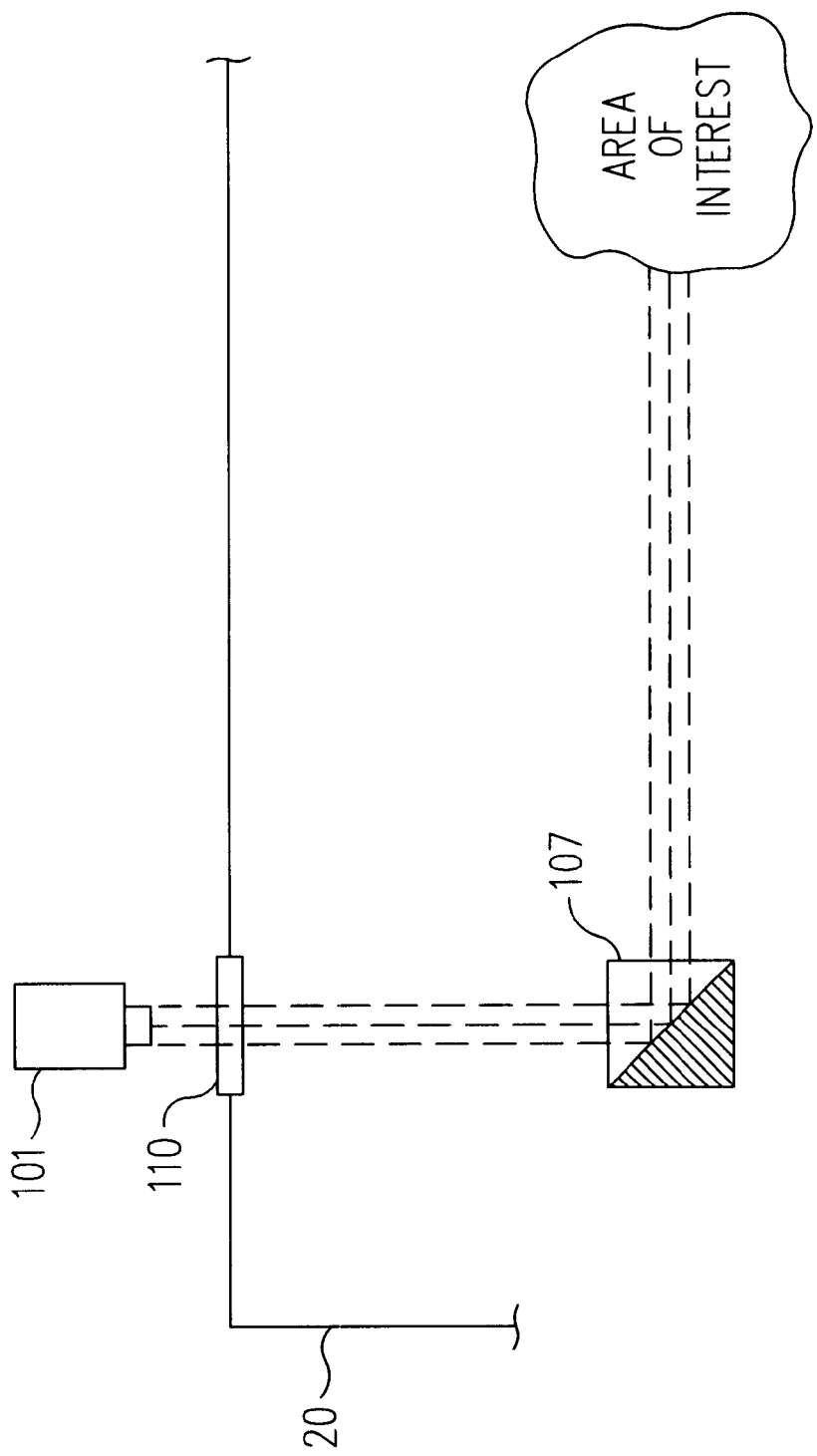
FIG. 3B illustrates a prism reflecting light to a camera mounted outside a chamber.
Figure 4B:
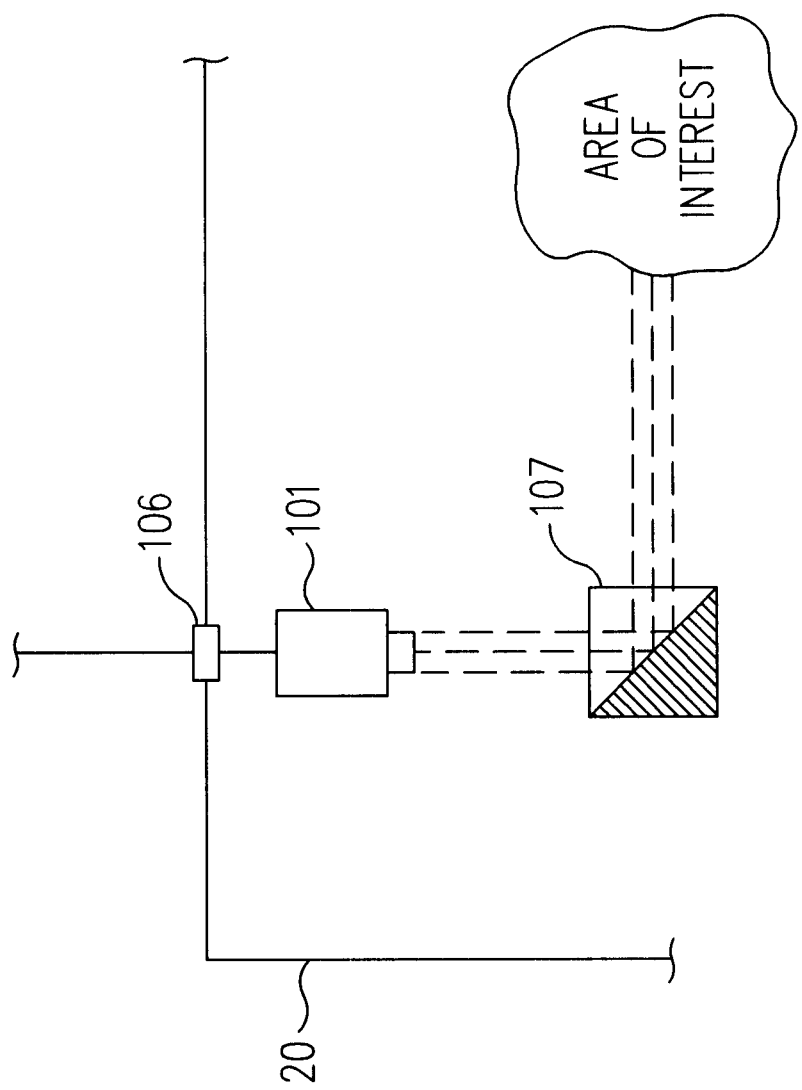
FIG. 4B illustrates a prism reflecting light to a camera mounted inside a chamber.

As seen in FIG. 3B, light from the area of interest, i.e., carrier 16, is reflected by prism 107 to camera 101 if camera 101 and prism 107 are aligned. As seen in FIG. 4A, camera 101 is mounted inside chamber 20 to acquire an image of carrier 16 in load lock 18. When camera 101 is mounted within chamber 20, a feedthru 106 for each camera is required on the top side of chamber 20 so as to allow signal transmission through the top side, using, for example, wires running between camera 101 and computer 105. The feedthru is sealed so as to prevent the flow of gas between the interior and exterior of chamber 20. FIG. 4B illustrates that light from the area of interest, for example, carrier 16, is reflected by prism 107 to camera 101 if camera 101 and prism 107 are aligned.

While FIGS. 3A, 3B, 4A and 4B illustrate specific examples of how camera 101 and prism 107 may be positioned inside, outside, and around chamber 20, the invention is not so limited. For example, prism 107 does not have to be mounted directly across or at a certain distance from carrier 16 because once an image is acquired, conventional image processing techniques are used (e.g., to digitally "tilt" or to "zoom" to a specific portion of the acquired image) to accommodate various camera 101 and/or prism 107 mounting configurations.

In the alternative, if camera 101 and prism 107 could not be directly aligned, at least one additional reflector could be positioned within chamber 20 to reflect images from prism 107 to camera 101.

As seen in FIGS. 3A & 4A, robot arm 22 operates within chamber 20. Prism 107 may be mounted to robot arm 22 using a number of means including, without limitation, bonding materials, adhesives, and screws. Prism 107 is preferably a 90 degree prism although prism 107 may be of any angular dimension, such as a 30-60-90 degree prism or a 45-45-90 degree prism, as long as prism 107 includes a right (i.e., 90 degree) angle. Manually adjustable fixed-angle mirror 108 could also be used to achieve a similar effect. Prism 107 can be made of glass, PYREX, or quartz. Camera 101, such as one of the types disclosed above, is used to capture the reflected images and is operationally connected to computer 105 which is operationally connected to robot 22. Computer 105 tracks the position and orientation of robot 22.

As stated above, chamber 20 is capable of operating in a number of pressure and temperature conditions, including atmospheric and vacuum pressures. Certain applications require vacuum pressure within chamber 20 while other applications require pure hydrogen, pure oxygen or pure nitrogen at various pressures. Certain applications require the absence of oxygen in chamber 20. As air contains oxygen and/or other types of potential contaminants, the contents of chamber 20 require isolation from potential contaminants. When a vacuum is created in chamber 20, robot 22 may be moved out of alignment as the shape of robot 22, as well as other materials and objects within chamber 20, may change from the shape exhibited at atmospheric pressure. Robot 22 may be internally pressurized such that the difference between the internal pressure within robot 22 and the external vacuum moves robot 22 out of alignment as the internal pressure may cause portions of robot 22 to expand. A vacuum within chamber 20 may also cause outgassing of materials within chamber 20. Potentiometers located within robot 22 enable computer 105 to track the movement of robot 22. Potentiometer readings are transmitted to computer 105 which is programmed with the potentiometer readings of robot 22 in an 'at rest' position. Changes in the potentiometer readings from the 'at rest' position enable computer 105 to calculate the position and orientation of robot 22.

The instant invention may be used for a number of applications, including but not limited to robot alignment automation, robot status live feedback, material tracking, movement error handling, wafer mapping, and material (cassette) load verification.

In accordance with an embodiment of the invention, automated robot alignment is facilitated by using a reflector to reflect images which enable a computer to determine the position of the robot with respect to a reference position. Alignment may occur in a variety of conditions that may exist within chamber 20 before, during and after semiconductor manufacturing. Changing conditions within chamber 20 may require re-alignment of robot 22 during a particular process even if robot 22 was aligned at the start of the process. For example, robot 22 may be perfectly aligned with a particular target area in chamber 20 when chamber 20 is at atmospheric pressure but robot 22 may be forced out of that alignment when a vacuum condition is required within chamber 20. The vacuum may cause a change in the volume of robot 22 which may result in robot 22 moving out of alignment. Computer controlled digital vision is used in conjunction with the reflector inside chamber 20 to determine the position of robot 22. Camera 101, mounted on top of chamber 20, views robot 22 through a window 110 on the top of the chamber 20 and can determine arm radius R of robot 22 as well as the angular orientation Θ of robot arm 22. The reflector reflects an image of the interior of chamber 20, in particular, the interior vertical sides of chamber 20. Using the image reflected through the reflector, the vertical position of robot 22 (i.e., the robot's position along the Z-axis) can be determined. The position of robot 22 may then be determined by comparing the reflected image to a reference image stored in computer 105. The position of robot 22 may also be determined by computer 105 comparing the position of a known reference mark in the reflected image to the position of crosshairs created by camera 101 and superimposed on the reflected image by computer 105. The controlling computer 105 determines the position of robot 22 with respect to the reference marks and moves robot 22 into alignment. Thus, robot 22 setup (i.e., setting coordinates) is performed and visually verified.

Using a reflector allows a user to obtain live feedback of the status of robot 22. A video signal from the computer controlled digital vision can be displayed on a User Interface (UI) screen. The user may be in a location with respect to chamber 22 that does not provide the user with a direct view of robot 22.

In the semiconductor manufacturing industry, wafer movement verification was traditionally accomplished with simple binary sensors. Using computer-controlled vision, semiconductor materials being transported on robot arm 22 can be tracked. Traditionally, the semiconductor wafer rests on an end effector 60 of robot arm 22. The image of the wafer reflected by the reflector to camera 101 is used by computer 105, after processing the image transmitted to computer 105 by camera 101, to verify wafer movement.

Traditional binary sensors are not helpful when a wafer slides/moves from its proper position. In accordance with one embodiment of this invention, a reflector allows movement error handling problems to be addressed. Using computer controlled digital vision, robot 22 adjusts its position with respect to the orientation of wafer 24 on end effector 60 via the visual information reflected by the reflector to camera 101 which passes the image to computer 105 for processing. Prior to semiconductor processing, robot 22 is manually adjusted by a user into alignment with a reference position. Manual adjustment by a user may include the user adjusting the position of robot 22 by computer 105 or by using a hand-held keypad of a type known in the art. The reference position of robot 22 is then stored in computer 105. The stored data serves as a reference for future robot alignment determinations.

Figure 5A:
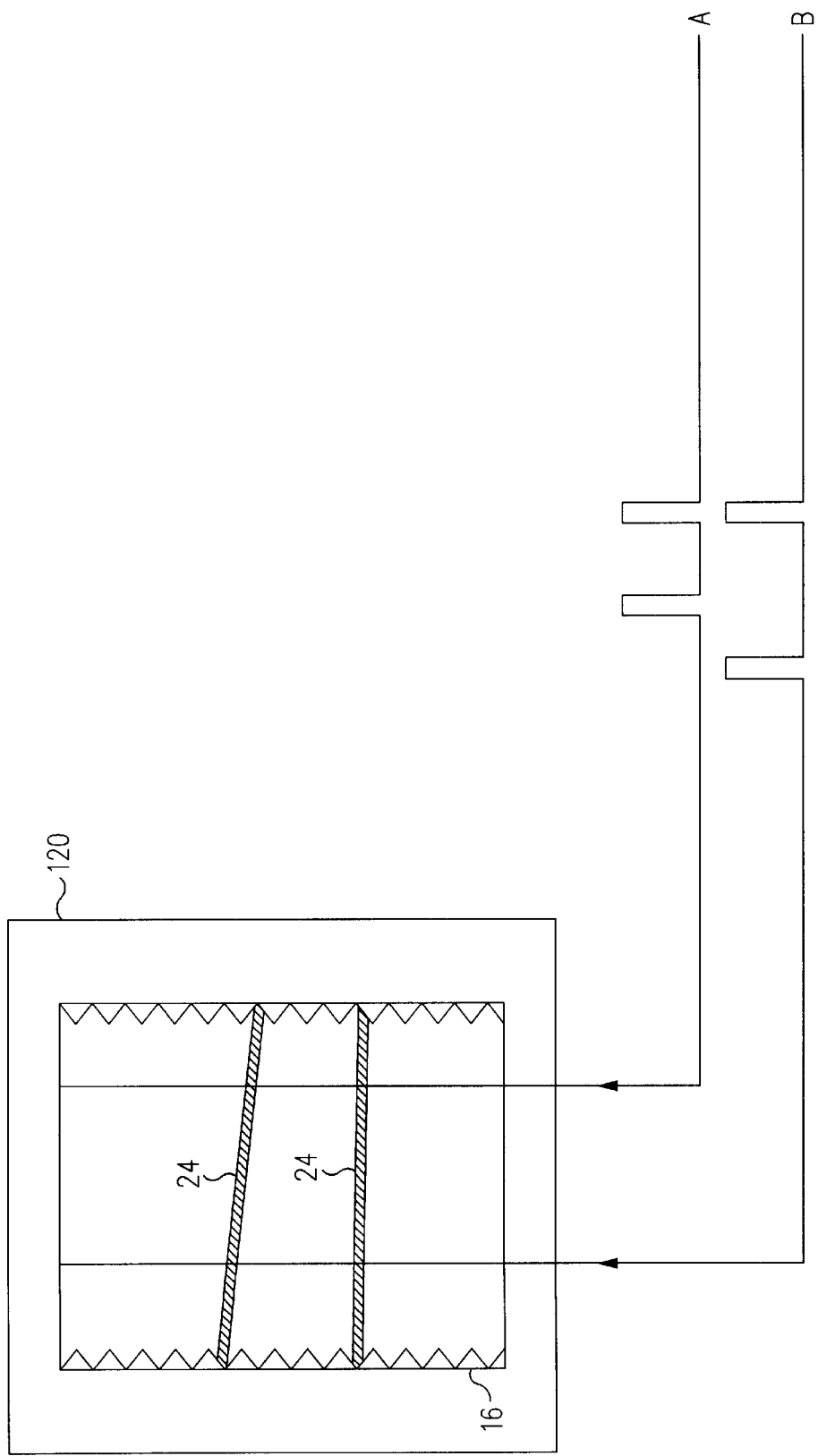
FIG. 5A illustrates the detection of a cross-slotted wafer.

In accordance with one embodiment of this invention, wafer mapping of wafers 24 in cassette 16 in chamber 20 is made possible even though a camera 101 may not have a direct view of the slots in cassette 16. The reflector reflects a view of the cassette slot suitable for wafer mapping. From the reflected image or view, computer 105 may determine that a straight line in the reflected view, when compared against reference data, indicates a wafer is present in the slot of cassette 16. The reflected view allows a cross-slotted wafer to be detected as well as the presence of two wafers stacked one atop the other in single slot (i.e., a double-wafer situation), as seen in FIGS. 5A and 5B. A cross-slotted wafer is detected when a comparison by computer 105 of the slot image to a reference image determines an angular line in cassette 16 at an angle greater than 0.5 degrees from horizontal. As stated above, a representative camera system of the present invention that may be used for wafer mapping is fully disclosed in co-pending U.S. patent application Ser. No. 09/451,674 (Attorney Docket No. M-7770 US), which is herein incorporated by reference for all purposes.

For example, as seen in FIGS. 5A and 5B, respectively, the reflector reflects an image 120, 130 to camera 101 which sends the image data to computer 105 which determines if a wafer is properly oriented, cross-slotted or if two wafers are present in a single cassette slot. FIG. 5A illustrates the analysis of an image 120 of cassette 16 containing wafers 24. Image 120 is analyzed by computer 105. Image 120 includes an upper wafer 24 and a lower wafer 24. Signal A and Signal B are generated by computer evaluation of vertical segments of image 120. If wafer 24 is in a straight, or horizontal position, Signals A and B should be identical. The lower wafer 24 in cassette 16 is in a horizontal position, causing computer 105 to determine Signals A and B are identical. However, as the upper wafer 24 is cross-slotted, as seen in FIG. 5A, Signals A and B do not match, causing computer 105 to determine the presence of a cross-slotted wafer. If Signals A and B indicate a cross-slotted wafer by detecting, for example, an angular line at an angle greater than 0.5 degrees from horizontal, computer 105 executes appropriate instructions to rectify the condition. For example, computer 105 may be programmed to instruct robot 22 to remove the cross-slotted wafer and reposition the wafer in cassette 16.

FIG. 5B illustrates computer-analysis by computer 105 of image 130 of cassette 16 containing a double-wafer situation. Image 130 of cassette 16 is analyzed by computer 105. Signal A and Signal B are generated by evaluation of vertical segments of image 130. If a single wafer 24 in cassette 16 is in a horizontal position, as is lower wafer 24 in image 130, Signals A and B should be identical in signal width. The signal width must also fall within an acceptable range pre-programmed in computer 105 for a single wafer. However, if two or more wafers 24 are placed in the same slot, as is the case of the upper wafers 24 in cassette 16, even though Signals A and B are of identical signal width, the signal width falls outside the acceptable range pre-programmed in computer 105. If Signals A and B indicate a double-wafer, computer 105 executes instructions to rectify the condition. For example, computer 105 may be programmed to instruct robot 22 to remove one or both wafers 24 from the cassette slot and/or reposition each of the wafers 24 in separate slots in cassette 16.

In accordance with one embodiment of the invention, loading of semiconductor materials into cassette 16 can be verified and the position of the slot notches in cassette 16 can be determined using an image reflected by a reflector to camera 101 which transmits the image to computer 105 for processing. If a wafer 24 is placed into its proper position in cassette 16, the image reflected by the reflector to computer 105 via camera 101 (e.g., a computer controlled digital vision camera) may be used to confirm the accuracy of the placement of wafer 24 in cassette 16. An image of an empty or full slotted cassette 16 is stored in a database of computer 105. Computer 105 uses software to compare the stored information against the image transmitted to camera 101 by the reflector in order to verify proper positioning of the material.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as falling within the true spirit and scope of this invention.

We claim:

1. A method of robot automated alignment comprising:
   viewing a robot having an arm radius, angular orientation and vertical position wherein the robot is located within a chamber;
   determining the arm radius, angular orientation and vertical position of the robot wherein the vertical position of the robot is determined by viewing an image reflected by a reflector located within said chamber;
   comparing the arm radius, angular orientation and vertical position of the robot to pre-set positions; and
   adjusting the arm radius, angular orientation and vertical position of the robot to the pre-set positions.

2. The method of claim 1, wherein the arm radius and angular orientation of the robot are determined by viewing the robot from above.

3. The method of claim 1, wherein the vertical position of the robot is further determined by viewing the reflected image from above the robot.

4. The method of claim 1, wherein the image reflected by the reflector is viewed by a camera.

5. The method of claim 1, wherein the reflector is a prism.

6. The method of claim 1, wherein the reflector is a mirror.

7. A method of determining robot status via live feedback to a user comprising:

taking images of a robot having an arm radius, angular orientation and vertical position using a camera wherein the robot is located within a chamber and the vertical position of the robot is determined by viewing the images reflected by a reflector located within said chamber; and displaying the images on a user interface so that the user may view the robot in near real-time.

8. The method of claim 7, wherein the camera is computer controlled.

9. The method of claim 7, wherein the user is in a location where the user cannot see or view the robot directly.

10. The method of claim 7, wherein the camera is a computer controlled digital vision camera.

11. The method of claim 7, wherein the vertical position of the robot is further determined by viewing the reflected image from above the robot.

12. The method of claim 7, wherein the reflector is a prism.

13. The method of claim 7, wherein the reflector is a mirror.

14. A method of material tracking comprising:

viewing a robot having an arm radius, angular orientation and vertical position using a camera wherein the robot is located within a chamber and is holding a workpiece;

determining the arm radius, angular orientation and vertical position of the robot; and determining the position of the workpiece from the arm radius, angular orientation and vertical position of the robot wherein the vertical position of the robot is determined by viewing an image reflected by a reflector located within said chamber.

15. The method of claim 14, wherein the arm radius and angular orientation of the robot is determined by viewing the robot from above.

16. The method of claim 14, wherein the vertical position of the robot is determined by viewing the robot from above.

17. The method of claim 14, wherein the vertical position of the robot is further determined by viewing the reflected image from above the robot.

18. The method of claim 1, wherein the reflector is a prism.

19. The method of claim 1, wherein the reflector is a mirror.

20. A method of movement error handling comprising:

viewing a robot having an arm radius, angular orientation and vertical position using a camera wherein the robot is located within a chamber and is holding a workpiece;

determining the arm radius, angular orientation and vertical position of the robot;

determining the position of the workpiece from the arm radius, angular orientation and vertical position of the robot wherein the vertical position of the robot is determined by viewing an image reflected by a reflector located within said chamber;

comparing the position of the workpiece to a preset position; and adjusting the arm radius, angular orientation and vertical position of the robot so that the workpiece is moved to the pre-set position.

21. The method of claim 20, wherein the arm radius and angular orientation of the robot is determined by viewing the robot from above.

22. The method of claim 20, wherein the vertical position of the robot is determined by viewing the robot from above.

23. The method of claim 20, wherein the vertical position of the robot is further determined by viewing the reflected image from above the robot.

24. The method of claim 20, wherein the reflector is a prism.

25. The method of claim 20, wherein the reflector is a mirror.

* * * * *